(12) United States Patent
Jager et al.

(10) Patent No.: US 7,322,100 B2
(45) Date of Patent: Jan. 29, 2008

(54) METHOD FOR PRODUCING A MICROMACHINED LAYERED DEVICE

(75) Inventors: Edwin Jager, Linköping (SE); Magnus Krogh, Linköping (SE)

(73) Assignee: Micromuscle AB (SE)

( * ) Notice: Subject to any disclaimer, the term of this patent is extended or adjusted under 35 U.S.C. 154(b) by 0 days.

(21) Appl. No.: 10/553,447

(22) PCT Filed: Apr. 8, 2004

(86) PCT No.: PCT/SE2004/000561

§ 371 (c)(1),
(2), (4) Date: Oct. 26, 2006

(87) PCT Pub. No.: WO2004/092050

PCT Pub. Date: Oct. 28, 2004

(65) Prior Publication Data

US 2007/0050969 A1   Mar. 8, 2007

(30) Foreign Application Priority Data

Apr. 17, 2003   (SE) .................................... 0301144

(51) Int. Cl.
*H05K 3/02* (2006.01)
*H05K 3/10* (2006.01)

(52) U.S. Cl. .................. 29/846; 29/417; 29/592.1; 29/611; 29/842; 257/678; 361/803; 439/65; 439/329; 977/724

(58) Field of Classification Search ................. 29/417, 29/592.1, 611, 840–846; 257/678; 361/803; 439/65, 329; 977/724
See application file for complete search history.

(56) References Cited

U.S. PATENT DOCUMENTS

| 5,910,943 A | * | 6/1999 | Wickman .................... 370/279 |
| 6,103,399 A | | 8/2000 | Smela et al. |
| 6,212,252 B1 | * | 4/2001 | Kise et al. .................... 378/35 |

FOREIGN PATENT DOCUMENTS

JP   11-121900 A   4/1999
WO   WO-01/80286 A2   10/2001

OTHER PUBLICATIONS

Kovas et al., "Silicon Micromachining: Sensors to Systems", Analytical Chemistry, vol. 68, pp. 407A-412A, Jul. 1, 1996.
Smela, "Microfabrication of PPy microactuators and other conjugated polymer devices", J. Micromech. Microeng., vol. 9, No. 1, pp. 1-18, 1999, IOP Publishing Ltd.

* cited by examiner

*Primary Examiner*—Paul D. Kim
(74) *Attorney, Agent, or Firm*—Lerner, David, Littenberg, Krumholz & Mentlik, LLP

(57) ABSTRACT

Methods for producing micromachined layered devices having a membrane layer and a first and second layer on both sides of the membrane layer are disclosed. The method includes applying a membrane layer to a substrate, opening a window in the substrate so as to enable the addition of layers from both sides of the membrane layer while the substrate is made into a frame that supports the membrane layer during processing, adding at least one layer on each side of the membrane either simultaneously or on one side at a time, and removing the device from the substrate frame.

24 Claims, 4 Drawing Sheets

Fig. 1 - cont.
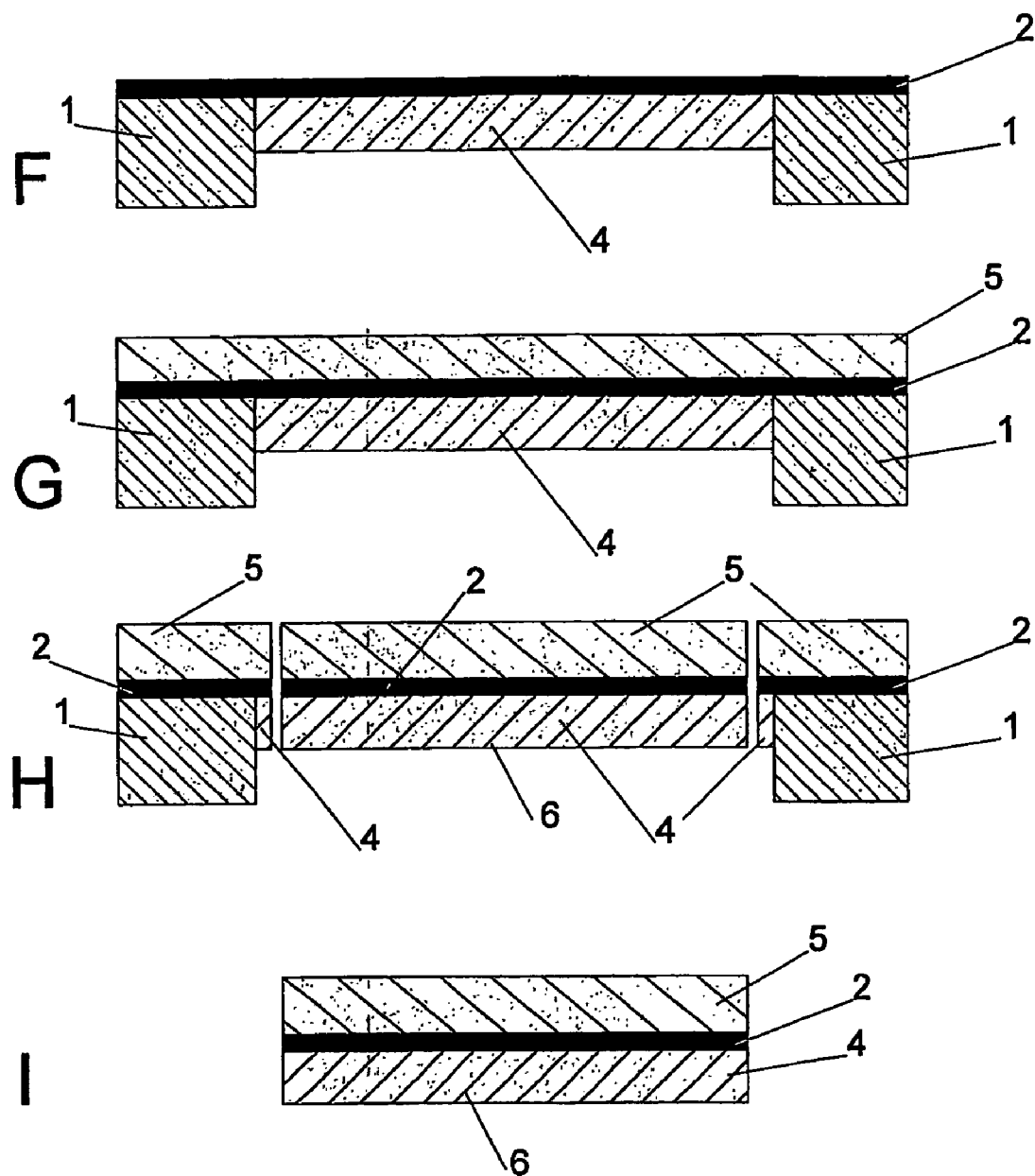

METHOD FOR PRODUCING A MICROMACHINED LAYERED DEVICE

FIELD OF THE INVENTION

The present invention relates to a method for producing a micromachined layered device comprising a membrane layer and a first layer on one side of the membrane layer and a second layer on the opposite side of the membrane layer.

BACKGROUND OF THE INVENTION

Batch fabrication of very small devices, such as electronics, sensors, and actuators, can be based on wafer handling systems, where the wafer functions as a substrate onto which the device is built during the production steps. The production of such devices is mostly done using a stacking method. The device is built by stacking layer on layer. Each layer can be of a different material, have a different thickness, and can be continuous over the device or laterally confined. The lateral shape of the layer can be defined by including a patterning step based on standard photolithography and microfabrication technologies. Common microfabrication processing steps are for instance ion diffusion, oxidation, deposition of material using e.g. spincoating, physical and chemical deposition methods, removal of materials using e.g. wet and dry etching methods. For an overview of such methods, reference is made to G. T. A. Kovacs, K. Petersen, and M. Albin, "Silicon micromachining; Sensors to systems", Analytical chemistry, 1996, 68, p. 407A-412A. In the last step the device can be removed from the substrate. Common methods are dicing and sacrificial layer. A method called "differential adhesion" is also used.

In dicing, the device, such as integrated circuits (computer chips) that has been built on a silicon wafer, is subsequently cut out using a saw. In this case the substrate becomes a part of the product. This can be a drawback, since the properties suitable for a material to hold a device during process not necessarily go together with the properties required for the final device.

The sacrificial layer method uses an intermediate, sacrificial layer between the substrate and device. The device is built up onto the sacrificial layer. The device is then released from the substrate by removing the sacrificial layer, e.g. by dissolving the layer using an appropriate etchant or solvent. These etchants or solvents can damage the layers of the device. Also, the removal process can take hours for large area devices.

The differential adhesion method is based on the poor adhesion between the top layer of the substrate and the bottom layer of the device. The device is built up using the above mentioned microfabrication steps. As a last step in the production the device is removed from the substrate, by "peeling" it loose. The technique of differential adhesion is described in U.S. Pat. No. 6,103,399.

All of the above production methods however have the disadvantage that these processes are bottom up processes. Only one side is available for processing. Layers are added on top of each other on one side of the device. This means that sensible materials that are added on the bottom side of the devices might be damaged by chemicals during the process. Due to the device design, these layers cannot be added at a later stage in the process, as this means that they will be on the topside of the device. Inversion of the process steps, i.e. starting with the "top layers" on the substrate is not always possible either. Which, for instance, is the case for processes such as electroplating and electropolymerisation where an electrically conducting seed layer is needed. The device can only be built as substrate/seed layer/electoplated layer and not vice versa.

It is therefore an object of the invention to solve the above-described problems.

SUMMARY OF THE INVENTION

In accordance with the present invention, these and other objects have now been realized by the invention of a method for producing a micromachined layered device comprising a membrane layer having a first side and a second side, a first layer on the first side of the membrane layer and a second layer on the second side of the membrane layer, the method comprising applying the membrane layer to a substrate, opening a window in the substrate whereby both sides of the membrane layer can be exposed for the addition of further layers thereonto while a portion of the substrate comprising a substrate frame supports the membrane layer during processing thereof, adding at least one layer to each of the first and second sides of the membrane layer, and removing the device from the substrate frame. Preferably, the opening of the window in the substrate employs a process such as laser ablation, wet chemical etching, solvating, or dry etching, such as reactive ion etching or sputter etching.

In accordance with one embodiment of the method of the present invention, the removing of the device from the substrate frame comprises a process such as wet chemical etching, reactive ion etching, dicing/sawing, cutting, such as utilizing scissors or a knife, laser ablation, or punching.

In accordance with another embodiment of the method of the present invention, the method includes a patterning step for altering the lateral dimensions of one of the layers of the device. Preferably, the patterning step comprises a process such as photolithography or soft lithography.

In accordance with another embodiment of the method of the present invention, the substrate comprises a polymer, a semiconductor, such as silicon, a metal, such as titanium, an alloy, such as stainless steel, or glass.

In accordance with another embodiment of the method of the present invention, the method includes adding at least one additional layer to the device, the additional layer and the membrane layer comprising a metal, a metal oxide, an alloy, and/or a ceramic material. The alloy includes alloys of metals such as gold, platinum, titanium, stainless steel, and aluminum oxide, as well as nickel titanium alloys. The ceramic can include hydroxyapatite.

In accordance with another embodiment of the method of the present invention, the method includes adding at least one additional layer to the device, the at least one additional layer comprising a conducting polymer or copolymer. Preferably, the conducting polymer or copolymer comprises a monomer such as pyrrole, aniline, thiophene, para-phenylene, vinylene, phenylene, and substituted forms of these monomers.

In accordance with another embodiment of the method of the present invention, the method includes adding at least one additional layer to the device, the at least one additional layer and the membrane layer comprising a polymer made from a monomer such as polyimide, polyamide, polyurethane, poly-(tetrafluorethylene), poly-(dimethylsiloxan), poly-(methylmethacrylate), polyesters, poly(vinyl chloride), and polyethylene, and substituted forms of these monomers.

In accordance with another embodiment of the method of the present invention, the opening of the window in the substrate comprises selectively removing a portion of the substrate under the membrane layer over an area greater than the predetermined final size of the device, whereby the removing of the device from the substrate frame comprises the membrane freely hanging in the substrate support frame providing access from both sides for additional processing, and including adding at least one additional layer to each side of the membrane. Preferably, the selective removal of the portion of the substrate comprises wet chemical etching. In accordance with another embodiment of the method of the present invention, the at least one additional layers added to each side of the membrane are added simultaneously. In another embodiment, the layers are added separately.

In accordance with another embodiment of the method of the present invention, the removing of the device from the substrate frame comprises partially cutting the device from the substrate frame, activating the partially cut device, and completely cutting the device from the substrate frame.

In accordance with another embodiment of the method of the present invention, the micromachined layered device comprises an actuator, and the method includes activating the device removed from the substrate frame.

In accordance with another embodiment of the method of the present invention, the micromachined layered device comprises a microactuator.

The above-referenced problems are solved by the method according to the present invention which method comprises the following steps:
 a) a membrane layer is applied on a substrate;
 b) a window in the substrate is opened so as to free the membrane layer in order to enable the adding of layers from both sides of the membrane layer while the substrate is made into a frame that supports the membrane layer during the processing;
 c) at least one layer is added on each side of the membrane either simultaneously or on one side at a time;
 d) the device is cut out and removed from the substrate frame.

By the word "membrane" is meant a thin film of one or more layers of material that sometime during the process is hanging freely between the substrate parts and is accessible for processing from both sides.

By the expression "layered devices" is meant not only products consisting of several layers of thin film but also devices comprising other non continuous components than thin films, such as laterally patterned structures.

The method according to the present invention makes both sides of the device accessible for processing. In this way a freer choice of processing can take place. Material layers that are sensible to chemicals used in the process can be deposited at a later stage.

A further advantage of the method according to the present invention is that the invention makes it possible to cut out the device without further processing, e.g. etchants.

Another advantage of the method according to the present invention is that the substrate does not form part of the final device. According to the method the device is cut out of the supporting frame. This is an advantage over prior art, since a device comprising the substrate when in use would be so thick that the device possibly would not work.

Yet another advantage of the method according to the present invention is that the method is suitable for batch fabrication of fragile devices.

Different methods can be used for performing step b) of the method, including any of the following methods: laser ablation, wet chemical etching, dissolving, and dry etching including reactive ion etching and sputter etching.

Different methods can be used for performing step d) of the method including any of the following methods: wet chemical etching, dry etching including reactive ion etching and sputter etching, dicing/sawing, cutting with scissors or a knife, laser ablation, or punching.

Step d) may be divided into two steps, where the device is partially cut out in a first step, then activated, followed by a step where the device is completely cut out from the substrate. Step d) may also be a one step action, after which the device is being activated in a following step e) after the cutting out of the device.

The method of the present invention can comprise further steps in addition to step a) to d). For instance, a patterning step to alter the lateral dimensions of an added layer, using for instance photolithography or soft lithography.

The substrate may be of a polymeric material, a semiconductor material, e.g. silicon or a metal, including alloys, such as titanium, or stainless steel. Other materials such as glass are also suitable for the substrate layer.

The device layers, i.e. all/any of the layers of the final device, both the membrane layer and the layers added thereafter, may be made of different materials chosen for the purpose of use. For instance, the device layers can be made of layers of metals, metal oxides, or an alloy of metals, including gold, platinum, titanium, stainless steel, aluminium oxides, and a nickel-titanium alloy. Also ceramics, such as hydroxyapatite can be used as a device layer. Other suitable materials for the device layers are conducting polymers, including pyrrole, aniline, thiophene, para-phenylene, vinylene, and phenylene polymers and copolymers thereof, including substituted forms of the different monomers.

Also polymers such as polyimide, polyamide, polyurethane, poly-(tetrafluorethylene), poly-(dimethylsiloxan) (silicon rubber), poly(methylmethacrylate), polyesters, poly (vinyl chloride), and polyethylene, including copolymers and substituted forms of the different monomer thereof, epoxies, and resins are suitable as device layers.

The present invention also relates to a device produced by the above method wherein the device is a microactuator. This means that it is an actuator that has a lateral dimension in the micrometer to centimeter scale and a thickness in the nanometer to millimeter scale.

Preferably, but not necessarily, the methods steps a) to d) are performed in alphabetical order.

According to an embodiment of the present invention the membrane layer of the device is deposited on the substrate. Hereafter, the substrate is selectively removed, e.g. by wet chemically etching, under the membrane layer over an area that at least is slightly larger than the final device size. Now, the membrane is freely hanging in the substrate support frame and can be accessed from both sides for additional processing, such as adding one or more layers on either side or both sides. In the last step the device is removed from the frame.

DETAILED DESCRIPTION

Figure 1:
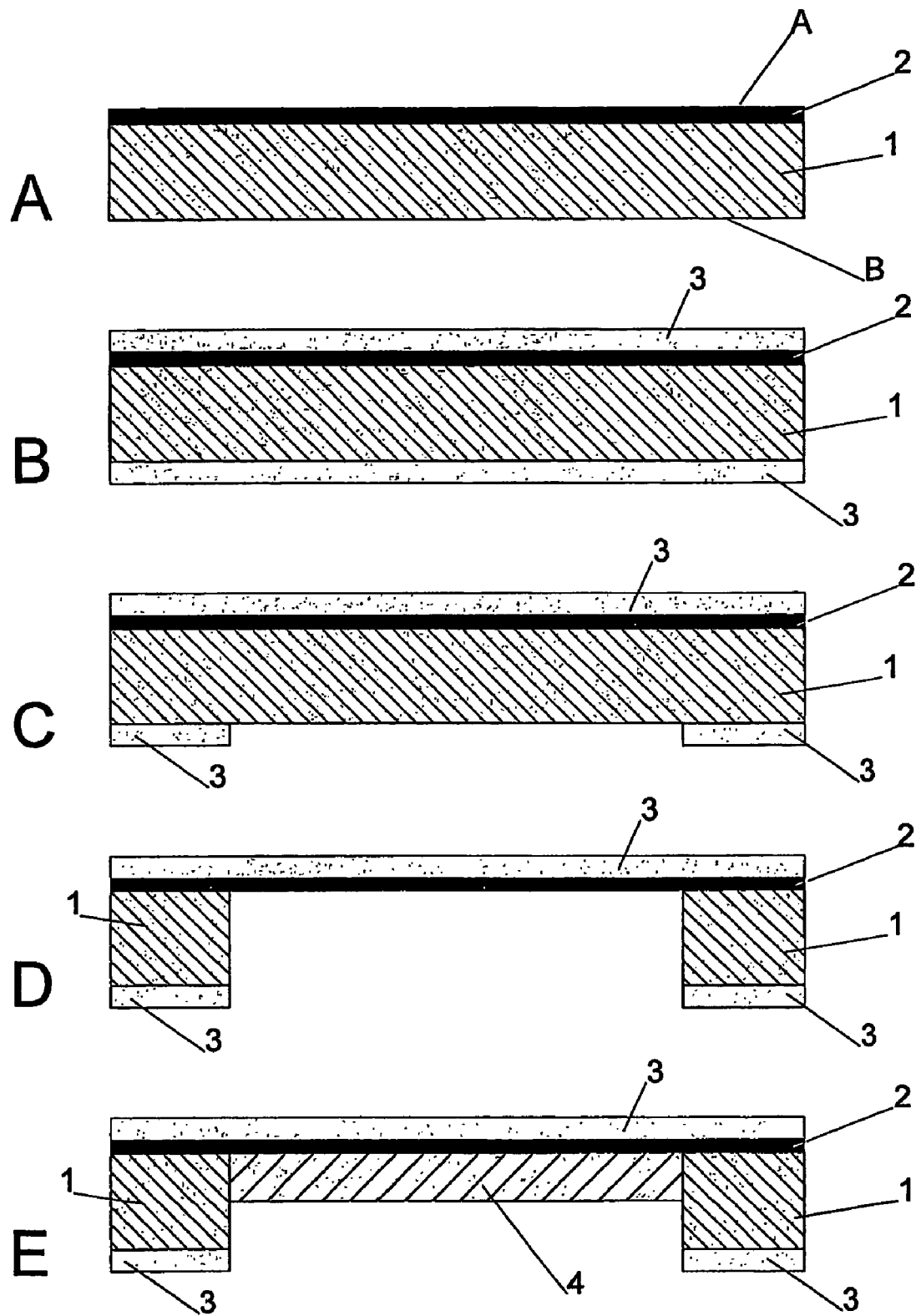
FIG. 1 is a side, elevational, schematic view of production steps A through I according to one embodiment of the present invention.

FIG. 1 discloses one embodiment of the invention. In FIG. 1 the production steps are schematically shown. As an example, the production method of an electro-active polymer actuator is shown. However, the invention is not limited to the fabrication of such devices.

As a substrate 1, a thick sheet of titanium is used. The substrate may be of different configurations, such as wafers, pieces, foils, and discs and different materials including metals, semiconductors, plastics, and glass. The substrate may be made in other configurations also, provided that the parameters for enabling are fulfilled. For instance that there is a plane area on the substrate for adding layers. The substrate 1 exhibits a first side A, and a second opposing side B. On side A of the substrate 1, a membrane layer 2 of gold is deposited using for instance thermal evaporation or sputtering (FIG. 1A).

Hereafter, a layer of photoresist 3 is deposited in a conventional manner on both sides of the substrate 1 (FIG. 1B). Using standard photolithography, a pattern on side B of the substrate 1 is opened (FIG. 1C). Hereafter, the titanium substrate 1 is wet chemically etched. The substrate 1 is etched until the gold layer 2 is reached. Now a gold membrane has been fabricated, that can be processed on either or both sides (FIG. 1D). In order to make the actuator device, device processing is continued on side B of the substrate 1 while the protective photoresist layer 3 on side A is not removed. This photoresist layer 3 will protect side A during processing of side B. A layer of polypyrrole 4 is deposited on side B of the gold layer 2 using electropolymerisation from an aqueous electrolyte containing pyrrole monomers and a salt (FIG. 1E).

The protective photoresist layer 3 is removed (FIG. 1F) and a structural polymer layer 5 is deposited on side A, for instance using spin coating (FIG. 1G).

The actuator 6 is now finished and can be cut out from the substrate 1 in its final lateral shape (FIG. 1H). This can be done for instance using wet chemical etching, Reactive Ion Etching, sawing, cutting with scissors or a knife, laser ablation, or punching. FIG. 1I shows the finished, cut out device.

Figure 2:
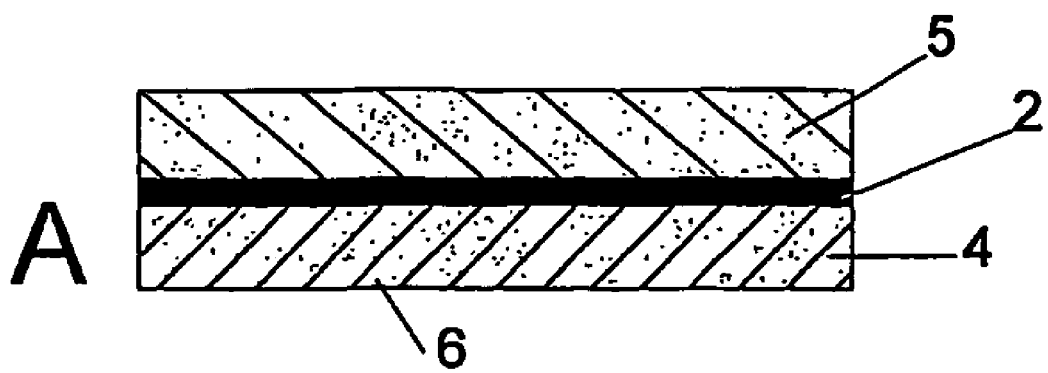
FIG. 2 is a side, elevational, schematic view of devices A and B made according to the present invention after it has been removed from the substrate and the device in an activated state.
Figure 2:
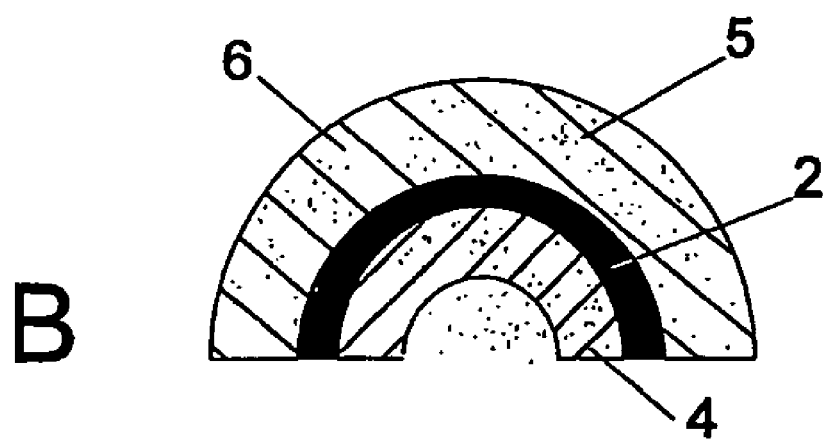

FIG. 2 shows how the actuator 6 will be activated when it has been cut out and removed from the substrate 1. In FIG. 2A the actuator 6 is in its unactivated, newly produced state. In FIG. 2B the actuator has been activated and is in a bent state. This kind of actuator is electrochemically activated. More information about these electrochemical polymer actuators can be found in E. Smela, "Microfabrication of PPy microactuators and other conjugated polymer devices", J. Micromech. Microeng., 1999, 9(1), pp. 1-18.

Figure 3:
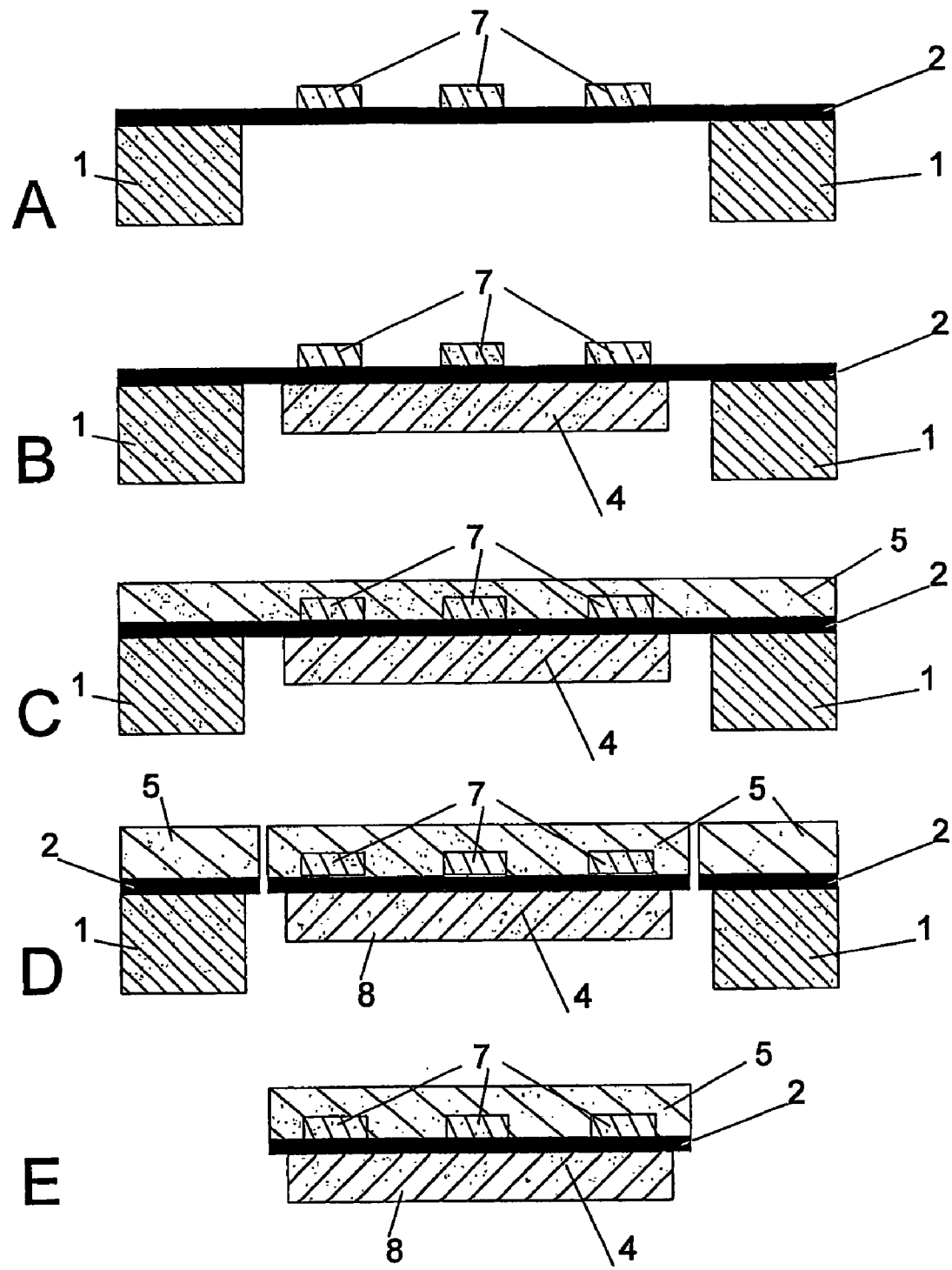
FIG. 3 is a side, elevational, schematic view of production steps A through C according to a second embodiment of the present invention.

The process scheme described above is an example of fabricating a device, in this case an electrochemical, polymer actuator. The method is not limited to the process of fabricating a three-layer actuator. Those skilled in the art notice that other combinations are possible. The layers 2, 4, and 5, can each comprise of several layers, materials, or thicknesses. The layers 4 and 5 do not have to be continuous layers but can also comprise of patterned structures e.g. beams or rod shaped elements. The structures can be added, on either or both sides. FIG. 3 shows an example of such a device. Here, four materials are used, two being patterned. The steps of fabricating the membrane are not shown, but can be made in a manner corresponding to that shown in FIG. 1A to FIG. 1D, whereafter the photoresist has been removed. I.e. the structure shown in FIG. 1D but without the photoresist is the starting point in FIG. 3A. After the fabrication of the membrane, patterned structures 7 of a fourth material are deposited on side A of the membrane (FIG. 3A). Hereafter, a second layer 4 is deposited on side B (FIG. 3B), followed by a patterned third layer 5 on side A (FIG. 3C). Finally, the device 8 is cut out of the substrate 1 (FIG. 3D). FIG. 3E shows the finished device 8, which can be used outside the substrate.

The addition of materials to the device can be done on one side at the time as shown in FIG. 1 and FIG. 3, but also on both sides simultaneously. Some deposition methods, such as electrochemical deposition on a conducting substrate, require that when only processing one side, the other side is protected in order not to deposit on that side as well. For instance, a layer of photoresist could be used for this purpose as is shown in FIG. 1D and FIG. 1E. Other deposition methods, including spin coating and physical vapour deposition, only cover one side and do not need such a protection layer, as is shown in FIG. 1F through FIG. 1G. The sequence onto which side the materials are added is of no importance to the method, but depends on process parameters such as the materials to be added, the device, and production methods. One could deposit all materials on one side first and finish on the other side, or deposit on either side alternatingly. With alternatingly means that one or several layers are deposited on one side and then on the other side.

In another embodiment of the invention the device, for instance a microactuator is fabricated according to step a through c (FIGS. 1A through 1G). Hereafter the device is partially cut out followed by further processing. Next, the device is completely cut out and thus removed from the substrate. Now that the device has been removed from it supporting frame, it can be used as intended, e.g. as a microactuator. An advantage with this method is that several microactuators may be activated in one action.

In the figures the fabrication of one device is shown. The method includes batch fabricating many such devices simultaneously by having many such devices on a single substrate. The devices that are manufactured simultaneously can be both identical and different.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method for producing a micromachined layered device comprising a membrane layer having a first side and a second side, a first layer on said first side of said membrane layer and a second layer on said second side of said membrane layer, said method comprising applying said membrane layer to a substrate, opening a window in said substrate whereby both sides of said membrane layer can be exposed for the addition of further layers thereonto while a portion of said substrate comprising a substrate frame supports said membrane layer during processing thereof, adding at least one layer to each of said first and second sides of said membrane layer, and removing said device from said substrate frame.

2. The method of claim 1 wherein said opening of said window in said substrate comprises a process selected from the group consisting of laser ablation, wet chemical etching, solvating, and dry etching.

3. The method of claim 2 wherein said dry etching comprises a method selected from the group consisting of reactive ion etching and sputter etching.

4. The method of claim 1 wherein said removing of said device from said substrate frame comprises a process selected from the group consisting of wet chemical etching, reactive ion etching, dicing/sawing, cutting, laser ablation, and punching.

5. The method of claim 4 wherein said cutting is carried out by means of a device selected from the group consisting of a scissors and a knife.

6. The method of claim 1 further comprising a patterning step for altering the lateral dimensions of one of said layers of said device.

7. The method of claim 6 wherein said patterning step comprises a process selected from the group consisting of photolithography and soft lithography.

8. The method of claim 1 wherein said substrate comprises a material selected from the group consisting of a polymer, a semiconductor, a metal, an alloy, and glass.

9. The method of claim 8 wherein said semiconductor comprises silicon.

10. The method of claim 8 wherein said metal comprises titanium.

11. The method of claim 8 wherein said alloy comprises stainless steel.

12. The method of claim 1 further comprising adding at least one additional layer to said device, said additional layer and said membrane layer comprising a material selected from the group consisting of a metal, a metal oxide, an alloy, and a ceramic.

13. The method of claim 12 wherein said alloy comprises an alloy of a metal selected from the group consisting of gold, platinum, titanium, stainless steel, aluminum oxide, and nickel titanium alloy.

14. The method of claim 12 wherein said ceramic comprises hydroxyapatite.

15. The method of claim 1 further comprising adding at least one additional layer to said device, said at least one additional layer comprising a conducting polymer or copolymer.

16. The method of claim 15 wherein said conducting polymer or copolymer comprises a monomer selected from the group consisting of pyrrole, aniline, thiophene, paraphenylene, vinylene, phenylene, and substituted forms of said monomers.

17. The method of claim 1 further comprising adding at least one additional layer to said device, said at least one additional layer and said membrane layer comprising a polymer comprising a monomer selected from the group consisting of polyimide, polyamide, polyurethane, poly-(tetrafluorethylene), poly-(dimethylsiloxan), poly-(methylmethacrylate), polyesters, poly(vinyl chloride), and polyethylene, and substituted forms of said monomers.

18. The method of claim 1 wherein said opening of said window in said substrate comprises selectively removing a portion of said substrate under said membrane layer over an area greater than the predetermined final size of said device, whereby said removing of said device from said substrate frame comprises said membrane freely hanging in said substrate support frame providing access from both sides for additional processing, and including adding at least one additional layer to each side of said membrane.

19. The method of claim 18 wherein said selective removal of said portion of said substrate comprises wet chemical etching.

20. The method of claim 18 wherein said at least one additional layers added to each side of said membrane are added simultaneously.

21. The method of claim 18 wherein said at least one additional layers added to each side of said membrane are added separately.

22. The method of claim 1 wherein said removing of said device from said substrate frame comprises partially cutting said device from said substrate frame, activating said partially cut device, and completely cutting said device from said substrate frame.

23. The method of claim 1 wherein said micromachined layered device comprises an actuator, and including activating said device removed from said substrate frame.

24. The method of claim 1 wherein said micromachined layered device comprises a microactuator.

* * * * *